US006358863B1

(12) United States Patent
Desu et al.

(10) Patent No.: US 6,358,863 B1
(45) Date of Patent: Mar. 19, 2002

(54) OXIDE/ORGANIC POLYMER MULTILAYER THIN FILMS DEPOSITED BY CHEMICAL VAPOR DEPOSITION

(75) Inventors: Seshu B. Desu, Amherst, MA (US); John J. Senkevich, Blacksburg, VA (US)

(73) Assignee: Quester Technology, Inc., Fremont, CA (US)

( * ) Notice: Subject to any disclaimer, the term of this patent is extended or adjusted under 35 U.S.C. 154(b) by 0 days.

(21) Appl. No.: 09/303,231

(22) Filed: Apr. 30, 1999

(Under 37 CFR 1.47)

Related U.S. Application Data

(60) Provisional application No. 60/083,906, filed on May 1, 1998.

(51) Int. Cl.[7] .............................................. C23C 16/40
(52) U.S. Cl. ...................... 438/763; 438/780; 438/785; 438/790; 427/255.28; 427/255.6
(58) Field of Search .................... 427/255.28, 255.6; 438/763, 780, 785, 790

(56) References Cited

U.S. PATENT DOCUMENTS

| 3,268,599 A | 8/1966 | Chow et al. |
| 3,274,267 A | 9/1966 | Chow |

(List continued on next page.)

FOREIGN PATENT DOCUMENTS

| EP | 0 769 788 A2 | 4/1997 |
| JP | 60231442 | 11/1985 |
| WO | WO 97/14666 | 4/1997 |
| WO | WO97/15699 | 5/1997 |
| WO | WO 97/15951 | 5/1997 |
| WO | WO 98/24743 | 6/1998 |
| WO | WO 98/41490 | 9/1998 |
| WO | WO 99/21706 | 5/1999 |

OTHER PUBLICATIONS

Lee, J. "Transport Polymerization of Gaseous Intermediates and Polymer Crystals Growth", J. Macromol. Sci.–Rev. Macromol. Chem., C16(1), 79–127 (1977–1978), no month available.*

Kudo, et al., Characteristics of Plasma–CF Films for Very Low–K Dielectrics, Feb. 10–11, 1997, DUMIC Conference, 1997 ISMIC–222D/97/0034, 85–92.

Labelle, et al., Characterization of Pulsed–Plasma Enhanced Chemical Vapor Deposited Fluorocarbon Thin Films, Feb. 10–11, 1997, DUMIC Conference, 1997 ISMIC—222D/97/0034, 98–105.

Lang, et al., Vapor Deposition of Very Low K Polymer Films, Poly(Naphthalene), Poly(Fluorinated Naphthalene), Mat. Res. Soc. Symp. Proc., vol. 381, 45–50, 1995, (No Month).

(List continued on next page.)

*Primary Examiner*—Timothy Meeks
(74) *Attorney, Agent, or Firm*—Fliesler, Dubb, Meyer & Lovejoy

(57) ABSTRACT

Multilayer thin films consisting of alternating layers of oxide and organic polymer dielectric materials are manufactured by chemical vapor deposition using a CVD apparatus comprising separate precursor volatilization/dissociation areas. Methods are described for the manufacture of multilayered films. The electrical properties of the multilayered films make the films of embodiments of this invention suitable for use as dielectric materials for semiconductor manufacture. The multilayered films of embodiments this invention reduce RC delay and cross-talk, thereby permitting increased density, higher frequency performance and greater reliability of semiconductor devices for use in the electronics industry.

37 Claims, 9 Drawing Sheets

U.S. PATENT DOCUMENTS

| | | | |
|---|---|---|---|
| 3,342,754 A | 9/1967 | Gorham | |
| 3,440,277 A | 4/1969 | Holland et al. | |
| 4,291,244 A | 9/1981 | Beach et al. | 307/400 |
| 4,532,369 A | 7/1985 | Hartner | 585/428 |
| 4,618,878 A | 10/1986 | Aoyama et al. | 257/759 |
| 4,737,379 A | 4/1988 | Hudgens et al. | 427/575 |
| 4,911,992 A | 3/1990 | Haluska et al. | 428/698 |
| 5,139,813 A | 8/1992 | Yira et al. | 427/8 |
| 5,210,341 A | 5/1993 | Dolbier, Jr. et al. | 540/144 |
| 5,268,202 A | 12/1993 | You et al. | 427/255.6 |
| 5,302,555 A * | 4/1994 | Yu | |
| 5,324,813 A | 6/1994 | Hougham et al. | 528/353 |
| 5,334,454 A | 8/1994 | Caporiccio et al. | 428/412 |
| 5,352,487 A * | 10/1994 | Klinedinst et al. | |
| 5,424,097 A | 6/1995 | Olson et al. | 427/255.5 |
| 5,534,068 A | 7/1996 | Beach et al. | 118/719 |
| 5,536,317 A | 7/1996 | Crain et al. | 118/664 |
| 5,536,319 A | 7/1996 | Wary et al. | 118/719 |
| 5,536,321 A | 7/1996 | Oslen et al. | 118/719 |
| 5,536,322 A | 7/1996 | Wary et al. | 118/719 |
| 5,536,892 A | 7/1996 | Dolbier, Jr. et al. | 570/144 |
| 5,538,758 A | 7/1996 | Beach et al. | 427/255.6 |
| 5,556,473 A | 9/1996 | Olson et al. | 118/719 |
| 5,637,395 A | 6/1997 | Uemura et al. | 428/343 |
| 5,650,041 A | 7/1997 | Gotoh et al. | 438/618 |
| 5,759,906 A | 6/1998 | Lou | 438/623 |
| 5,783,614 A | 7/1998 | Chen et al. | 532/205 |
| 6,051,321 A * | 4/2000 | Lee et al. | |
| 6,086,679 A * | 7/2000 | Lee et al. | |

OTHER PUBLICATIONS

McClatchie, et al., Low Dielectric Constant Flowfill Technology for IMD Applications, Feb. 10–11, 1997, DUMIC Conference, 1997 ISMIC—222D/97/0034, 34–40.

Robles, et al., Characterization of High Density Plasma Chemical Vapor Depositied –Carbon and –Fluorinated Carbon Films for Ultra Low Dielectric Applications, Feb. 10–11, 1997, DUMIC Conference, 1997 ISMIC—222D/97/0034, 26–33.

Shranagpani, et al., Advantages of Chemical Vapor Deposition Over Conventional Techniques for the Processing of Amorphous Teflon Fluoropolymer, Feb. 10–11, 1997, DUMIC Conference, 1997 ISMIC—222D/97/0034, 117–120.

Shimogaki, et al., How Low Dielectric Constant of F–Doped $SiO_2$ Films Can Be Obtained, Feb. 10–11, 1997, DUMIC Conference, 1997 ISMIC—222D/97/0034, 189–196.

Sugahara, et al., Low Dielectric Constant Carbon Containing $SiO_2$ Films Deposited By PECVD Technique Using a Novel CVD Precursor, Feb. 10–11, 1997, DUMIC Conference, 1997 ISMIC—222D/97/0034, 117–120.

Tamura, et al., Preparation of Stable Fluorine–doped Silicon Oxide Film by Biased Helicon Plasma CVD, Feb. 10–11, 1997, DUMIC Conference, 1997 ISMIC—222D/97/0034, 121–124.

Selbrede, et al., Characterization of Parylene–N Thin Films for Low Dielectric Constant VLSI Applications, Feb. 10–11, 1997, DUMIC Conference, 1997 ISMIC—222D/97/0034, 121–124.

Wang, et al., Parylene–N Thermal Stability Increase by Oxygen Reduction–Low Substrate Temperature Deposition, Preannealing, and PETEOS Encapsulation, Feb. 10–11, 1997, DUMIC Conference, 1997 ISMIC—222D/97/0034, 125–128.

Wary, et al., Polymer Developed to be Interlayer Dielectric, Semi–conductor International, 211–216, Jun. 1996.

Jozef Bicerano, Predition of Polymer Properties, Second Edition, Marcel Dekker, Inc., pp. 1–15, 50–61, 108–111, and 280–295. No date.

* cited by examiner

FIG.—5

OXIDE/ORGANIC POLYMER MULTILAYER THIN FILMS DEPOSITED BY CHEMICAL VAPOR DEPOSITION

RELATED APPLICATION

This application claims the benefit of U.S. provisional application 60/083,906, filed May 1, 1998.

United States Utility Patent Application titled: "Near-Room Temperature Thermal Chemical Vapor Deposition of Oxide Films." Inventors: Seshu B. Desu and John J. Senkevich, Ser. No. 09/302,938, filed Apr. 30, 1999.

BACKGROUND OF THE INVENTION

I. Field of the Invention

The field of the invention comprises methods for the manufacture of thin films for manufacture of semiconductor devices. More specifically, the invention comprises methods for the manufacture of multi-layered thin films comprising an oxide such as $SiO_2$ and an organic polymer such as poly(chloro-p-xylylene).

II. Discussion of Related Art

Both the synthesis and understanding of multilayer polymer/ceramic structures are important for many applications (Sanchez, *Physics of Polymer Surfaces and Interfaces*, Butterworth-Heinemann, Boston, Mass. (1992)). Among these applications are the need for thin film polymers for electronic packaging, coatings, passivation layers, lubrication, biocompatible materials, and intermetallic dielectrics for ULSI devices. Currently, a major need exists to replace silicon dioxide ($SiO_2$) with a low dielectric constant material such as a polymer to reduce RC-delay, power consumption and cross-talk in ultra large scale integration (USLI) devices (Moore et al., *Microelectronics Technology ACS symposium* series 614: 449–70 (1995); Zhang, *Thin Solid Films* 270:508–511 (1995); Majid, *J. Electron. Mat.* 18(2):301–311 (1989); Whittington et al., *IEEE Trans. CHMT* 1(4):416–222 (1978)).

However, before integrating a totally polymeric intermetallic dielectric, different hybrid integration schemes have been proposed (Zhao et al, T.E. Seidel *Mat. Res. Soc. Symp. Proc.* 427:415–426 (1996)). They use $SiO_2$ and functionalized poly(p-xylylene) derivatives to take advantage of the good adhesion properties and thermal stability of $SiO_2$ while also taking advantage of the polymer's low dielectric constant which would ultimately reduce the RC-delay in ULSI devices. The ability to deposit $SiO_2$ and a polymer by the methods of chemical vapor deposition at the same temperature and pressure would reduce the processing expense for these hybrid structures and other applications which rely on multilayer structures.

The previous methods for depositing $SiO_2$ use high temperatures or plasma processes prohibitive for the CVD of polymers. High deposition temperatures for $SiO_2$ deposition would necessitate separate deposition chambers, one at high temperature for $SiO_2$ deposition, and another at low temperature for polymer deposition. Plasma processes add defects to the polymer structures, and thermal CVD method for $SiO_2$ deposition is appropriate for polymer/$SiO_2$ CVD of multilayer structures.

Polymers themselves have complex anisotropic morphological structures. However, with the presence of $SiO_2$, specific interactions and physical confinement causes the thin film polymers to have an even more complex morphology (Bitsanis et al., *J. Chem. Phys.* 92(6):3827–3847 (1990); Prest et al., J. Appl. Phys. 50(10): 6067–6071 (1979); Prest et al., *J. Appl. Phys.* 51(10): 5170–5174 (1980)). One very noticeable effect the specific interactions and physical confinement have on the polymer is its crystallization behavior due to the cooperative motion of the polymer chains (Frank, *Science* 273:912–915 (1996); Despotopoulou et al., *Macromolecules* 29:5797–5804 (1996); Billon et al., *Colloid Polym. Sci.* 272:633–654 (1996); Billon et al., *Colloid Polym. Sci.* 267:668–680(1989); Escline et al., *Colloid Polym. Sci.* 262:366–373 (1984)). These studies looked at the polymer crystallization of spin-coated polymer ultra-thin films which are wet-chemical deposition techniques. However, independent of the deposition method, the effect of constrainment reduces the mobility of the ultra-thin polymeric films.

Further, spin-coated or dip-coated methods for depositing thin films are not advantageous in fabricating ULSI devices due to low processing throughput, inability to fill gaps, poor conformality of the film, incorporation of impurities into the film and the presence of solvent used to dissolve the film precursor, which is an environmental concern.

Other techniques exist for producing multilayer structures of alternating ceramic and polymer or alternating metal and polymer layers (Akelah et al., *Letters* 22:97–102 (1995); Vaia et al., *Chem. Mater.* 5:1694–1696 (1993); Fukushima et al., *J. Chem. So., Chem. Commun.* 241–242 (1995); Lvov et al., *Lanamuir* 12:3038–3044 (1996); Messersmith et al., *Chem. Mater.* 5:1064–1066 (1993)). However, these methods all require high temperature deposition of the ceramic layers, and therefore require changing deposition conditions for each layer. This decreases the efficiency of manufacturing by increasing the time needed to deposit the multilayered films.

Therefore, future methods for manufacturing integrated circuits must be developed to deposit multilayer structures at temperatures below the threshold temperature of the polymer, permitting the concurrent or sequential deposition of both the ceramic and organic polymer dielectric materials. The threshold temperature of the polymer is that temperature above which polymer deposition is not possible due to lack of physisorption of the reactive intermediates. The physisorption of a reactive intermediate is a function of the molecular weight, polarizability and structure of the intermediate. The reactive intermediates, in turn, are generated from the thermally dissociated precursor and are transported to a low temperature chamber where deposition and polymerization occur.

Therefore, one object of the invention is the development of methods for manufacturing thin films with low dielectric constant, high dielectric strength, high thermal stability, and high mechanical strength.

A further object of the invention is the manufacture of thin films at temperatures near or below room temperature.

A yet further object of the invention is the development of methods of manufacturing multilayered thin films at temperatures near or below room temperature.

An additional object of the invention is the manufacture of films with graded properties of dielectric constant, refractive index, and adhesion as a function of thickness.

SUMMARY OF THE INVENTION

This invention comprises methods for the deposition of oxide and polymer dielectric materials to form thin films for semiconductor manufacture.

Thus, one aspect of the invention comprises the development of methods for the deposition of alternating layers of oxide dielectric and organic polymer.

An additional aspect of the invention comprises the co-deposition of oxide and organic polymer dielectric layers at temperatures near or below room temperature.

A further aspect of the invention comprises a thin film made by deposition of alternating layers of oxide and organic polymer, each deposited at temperatures near room temperature.

Another aspect of the invention comprises a multilayered thin film with a dielectric constant lower than that of a pure oxide thin film.

Yet another aspect of the invention comprises a thin film with thermal stability and mechanical strength greater than that of a pure organic polymer thin film.

Another aspect of the invention comprises the manufacture of a semiconductor chip having a dielectric material with alternating layers of oxide and organic polymer.

A yet further aspect of the invention comprises the manufacture of a semiconductor device comprising a semiconductor chip with a dielectric material having alternating layers of oxide and organic polymer.

BRIEF DESCRIPTION OF THE DRAWINGS

The invention will be described with respect to the particular embodiments thereof Other objects, features, and advantages of the invention will become apparent with reference to the specification and drawings in which.

Figure 1:
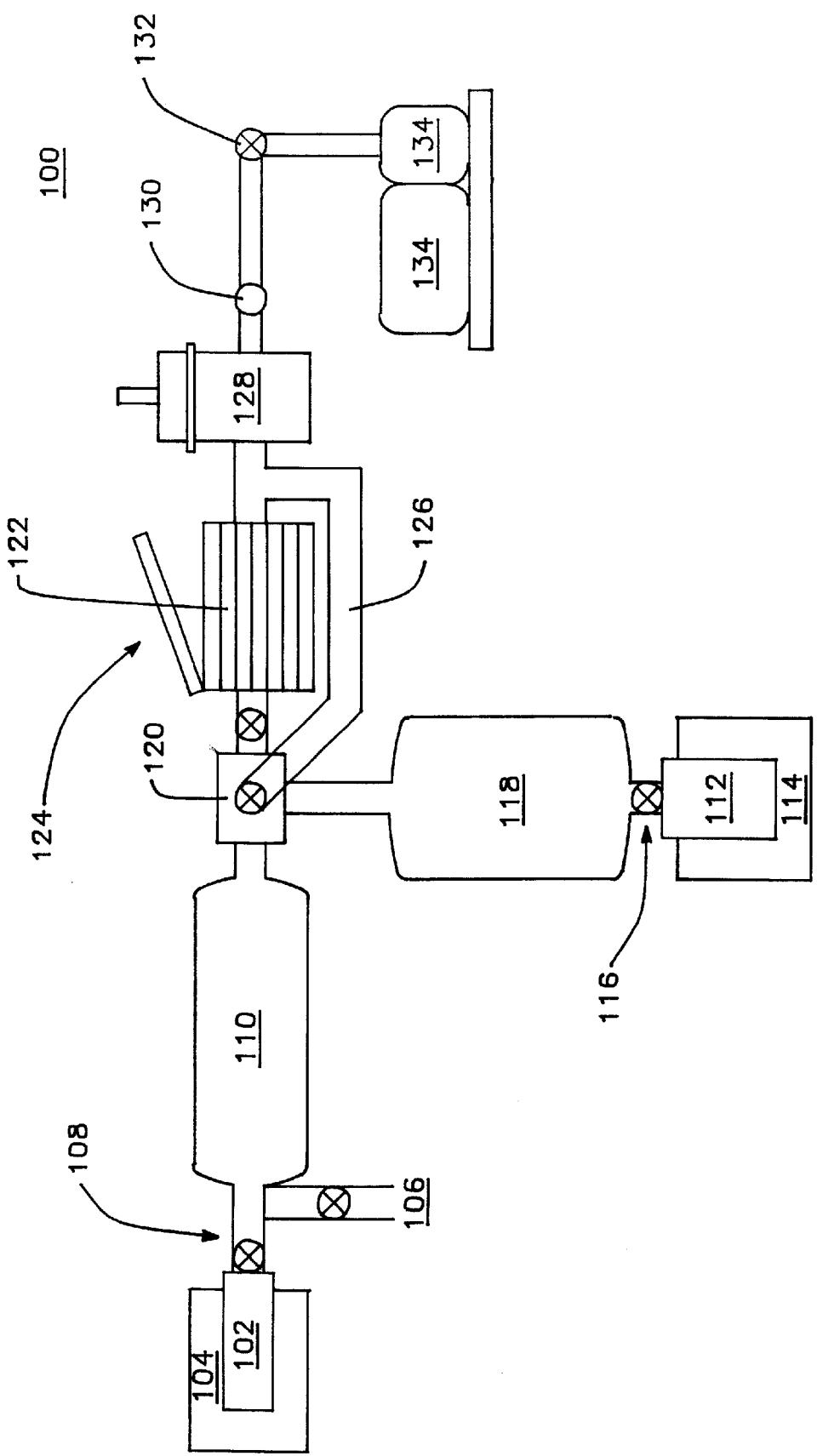
FIG. 1 depicts an embodiment of apparatus of the invention for chemical vapor deposition of multilayered films comprised of oxide and organic polymers.

The invention is more thoroughly explained in the Detailed Description of the Invention.

DETAILED DESCRIPTION OF THE INVENTION

I. Deposition of Multilayered Thin Films

The present invention comprises methods and apparatus for the deposition of thin films comprising alternating layers of an oxide, such as $SiO_2$ and an organic polymer such as poly(chloro-para-xylylene). Such methods are now possible, due to the development of low-temperature chemical vapor deposition (CVD) of $SiO_2$ (see co-pending Patent Application titled "Near-Room Temperature Thermal Chemical Vapor Deposition of Oxide Films" S. Desu et al; incorporated herein fully by reference). However, because the physical and chemical mechanisms for deposition of $SiO_2$ can be different from those mechanisms for deposition of polymer thin films using CVD methods, the mechanisms for deposition for each type of film can be different.

A. Oxide Dielectric Materials

As a constituent of the multilayer films, an oxide layer can be formed at near- or below room temperature starting with common alkoxy precursors. By way of example only, $SiO_2$ can be deposited from precursors such as diacetoxy-di-t-butoxysilane (DADBS) and tetraethoxysilane (TEOS), although many alkoxide precursors are suitable. A two-step reaction sequence is presented here but the formation of oxide thin films starting with an alkoxide precursor can be a multi-step reaction sequence. The methods of this invention are not limited to $SiO_2$, since other oxides such as $Al_2O_3$, $Y_2O_3$, $TiO_2$, $ZrO_2$, $Ta_2O_5$, $Nb_2O_5$, and ZnO can be formed through a similar mechanism starting with common alkoxy precursors. However, the preferred oxide is $SiO_2$. The method may be explained, in the case of $SiO_2$, by realizing that a two-step reaction sequence can exist:

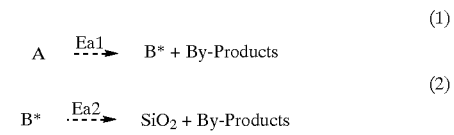

A is the alkoxy precursor, in certain embodiments diacetoxy-di-t-butoxysilane (DADBS), and B* is a relatively long-lived activated intermediate species. The ability to deposit $SiO_2$, $TiO_2$, $Al_2O_3$, or any other oxide at near-room temperature can occur for at least two reasons. First, a relatively long-lived activated intermediate species can be formed through reaction (1), which can then be transported to another chamber. Second, the activation energy, $Ea_2$, for reaction (2) can be sufficiently small to promote polymerization, because a large activation energy for reaction (2) can disfavor the formation of a polymer product. Reaction (2) can possess a lower activation energy because no chemical bonds are broken but instead a combination reaction can occur, whereby reactive intermediates react with each other and can polymerize on a substrate surface without the requirement for an added energy source. Similar thermodynamic relationships can apply to the dissociation and deposition of the organic polymer components of the films.

Additionally, the reactive intermediate species desirably can have a high mobility at the substrate surface. Good mobility permits the intermediates to gain access to small features in the substrate and in the developing film, and thereby can produce good gap filling. Furthermore, it can be desirable for the reactive intermediates to have reasonable rates of reaction at near-room temperatures. However, $Ea_1$ generally can be larger than Ea2, due to the requirement that bonds within the precursor be broken to form the reactive intermediates. For the case of $SiO_2$, the bond energy of the Si—O is 108 kcal/mol versus 86 kcal/mol for C—O (Lee et al., *J. Electrochem Soc.* 143(4): 1443–1451 (1996)). Therefore, the C—O bond preferentially breaks, leaving Si—O containing reactive intermediate, and an organic leaving group as a by-product. DADBS, like TEOS, has a C—O bond. However, the bond energy of the Si—O bond of DADBS is slightly weaker than the C—O bond of TEOS. The difference in bond energy is reflected in a lower temperature needed for pyrolysis for the reaction depicted in Reaction 1.

Many different organometallic precursors can be used to make the oxide layers of certain embodiments of this invention. In general, the precursor can desirably have a high vapor pressure at low temperatures without degrading. It is also desirable that the precursor be dissociable into reactive intermediates which can be transported in the gas phase, and that can react at the surface of semiconductor substrates at temperatures sufficiently low to avoid melting other pre-existing structures on the substrate. Generally, any oxide can be deposited using the methods of this invention which have one of the following general formulae:

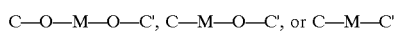

C—O—M—O—C', C—M—O—C', or C—M—C' where M is a metal atom, O is an oxygen atom, and C and C' are organic moieties which may be selected independently of each other. The number of oxygen-bonded metal atoms depends on the oxidation state of the metal. Typically, suitable oxides include silicates such as $SiO_2$, or other oxides such as $Al_2O_3$, $Y_2O_3$, $TiO_2$, $ZrO_2$, $Ta_2O_5$, $Nb_2O_5$, or ZnO. This list is by way of example only and is not intended to be limiting.

Exemplary precursors for the deposition of $SiO_2$ in which C and C' are the same include alkoxysilane precursors, DADBS ($C_{12}H_{24}O_6Si$), TEOS ($C_8H_{20}O_4Si$), tetraacetoxysilane ($C_8H_{12}O_8Si$), tetramethoxysilane (TMOS), tetraallyloxysilane ($C_{12}H_{20}O_4Si$), tetra-n-butoxysilane ($C_{16}H_{36}O_4Si$), tetrakis(ethoxyethoxy)silane ($C_8H_{36}O_8Si$), tetrakis(2-ethylhexoxy)silane ($C_{32}H_{68}O_4Si$), tetrakis(2-methoxycryloxyethoxy)silane ($C_{24}H_{36}O_{12}Si$), tetrakis(methoxyethoxyethoxy)silane ($C_{20}H_{44}O_{12}Si$), tetrakis(methoxyethoxy)silane ($C_{12}H_{28}O_8Si$), tetrakis(methoxypropoxy)silane ($C_{16}H_{36}O_8Si$), and tetra-n-propoxysilane ($C_{12}H_{28}O_4Si$). Also included are precursors in which C and C' are independently selected from the leaving groups of the above silanes.

Exemplary precursors for the deposition of other metal oxides include, by way of example only, aluminum (III) n-butoxide, yttrium isopropoxide, titanium-di-n-butoxide (bis-2,4-pentanedionate), zirconium isopropoxide, tantalum (V) n-butoxide, niobium (V) n-butoxide, and zinc n-butoxide.

It is understood that the above materials are by way of example only, and are not intended to limit the scope of the invention.

B. Organic Polymer Dielectric Materials

Many organic polymers can be used in the manufacture of multilayered films of embodiments of this invention. Examples of suitable polymers include poly(para-xylylenes), also known as parylenes. The polymers are made from the corresponding para-xylylene precursors. Suitable poly(para-xylylene) polymers can include poly(chloro-p-xylylene) (PPXC), poly(dichloro-p-xylylene (PPXDC) and poly(tetrafluoro-p-xylylene), poly(dimethoxy-p-xylylene), poly(sulfo-p-xylylene), poly(iodo-p-xylylene), poly(α, α, α', α', tetrafluoro-p-xylylene)(AF-4), poly(trifluoro-p-xylylene), poly(difluoro-p-xylylene) and poly(fluoro-p-xylylene). However, any precursor of a poly(para-xylylene) polymer could be used to make the homopolymeric nanocomposite thin film synthesized according to the methods of this invention. Examples of other poly(para-xylylenes) are included in Salome, *Polymeric Materials Encyclopedia*, CRC jPress, Boca Raton, Fla. (1996), herein incorporated fully by reference. Further, precursors of polyimides such as by way of example only, poly(N-phenylmaleimide), can be used.

To manufacture organic phases comprising copolymers of poly(para-xylylenes) and other organic species, precursors for the following organic polymers can be suitable: poly (maleimide/parylene) copolymer, poly acenaphthalene/ parylene copolymer, divinylbenzene/parylene copolymer, perfluorooctylmethacrylate (PFOMA)/parylene copolymer, 4-vinyl biphenyl/parylene copolymer, 9-vinylanthracene/ parylene copolymer, maleic anhydride/parylene copolymer, N-vinyl pyrrolidone/parylene copolymer, 4-vinylpyridine/ parylene copolymer, styrene/parylene copolymer, buckminsterfullerene/parylene copolymer, and trihydroperfluoroundecylmethacrylate/parylene copolymer. It is understood that any poly(para-xylylene) can be used in the above copolymers.

Additionally, precursors for the formation of cross-linked copolymers of certain embodiments of the invention can be used to manufacture the organic phase of nanocomposites. By way of example only, the following are useful: 2,3,5,7, tetravinyl, 1,3,5,7, tetramethylcyclotetrasiloxane/parylene, 1,3,5, trivinyl, 1,3,5, trimethylcyclotrisiloxane/parylene, tetravinylsilane/parylene/parylene, and 1,1,3,3, tetravinyldimethyldisiloxane/parylene. It is understood that any poly(para-xylylene) can be used for any of the above cross-linked copolymers.

Furthermore, covalent oxide-organic polymer phases can be manufactured using precursors including, by way of example only, vinyl triethoxysilane/parylene, vinyl triacetoxysilane/parylene, and vinyl tri-t-butoxysilane. It is understood that any poly(para-xylylene) can be used for any of the above oxide-organic polymer copolymers.

It is understood that the above materials are by way of example only, and are not intended to limit the scope of the invention.

II. Growth of Multilayered Dielectric Thin Films

Multilayer films can grown by deposition and polymerization of reactive intermediates at temperatures near or below room temperature using a reactor design which possesses at least two separate dissociation chambers, one for depositing oxides and another for depositing organic polymers (FIG. 1). The dissociation chambers can be connected to a single deposition chamber. By using separate dissociation chambers, two types of polymers can be deposited. By using more than two dissociation chambers, more types of polymers can be deposited. Each arm comprises its own vaporization/sublimation chamber and dissociation or pyrolysis chamber. Purposes of the dissociation chambers are to generate reactive intermediates which are transported to a deposition chamber where they can deposit on the surface of a substrate at temperatures below the temperatures needed to dissociate the precursor molecules.

The suitable conditions of vaporization or sublimation depend on the precursor used. Generally, temperatures in the range of about 10° C. to about 90° C. are suitable for the alkoxy organometallic precursors for oxide thin films. The pressure within the vaporization/sublimation chamber can be any pressure favoring evaporation of the precursor. Generally, pressures from about 0.01 Torr to about 1 Torr are suitable, with preferred pressures in the range of about 0.05 Torr to about 1 Torr, and more preferably from about 0.05 Torr to about 0.15 Torr.

After leaving the vaporization/sublimation chamber, the evaporated precursors can be dissociated in a dissociation chamber. The precursors can flow into the dissociation chamber by means of the pressure gradient or with the aid of a carrier gas such as $N_2$, argon, or other convenient, non-reactive gas. When precursors having a metal bonded directly to a carbon atom, such as in precursors having the formulas: C—M—O—C' and C—M—C', it can be desirable to use oxygen in the gas mixture. Oxygen can provide a reactive moiety that can assist in the dissociation of the precursor and yield a metal-oxygen reactive intermediate. The flow rate of the precursor stream can be regulated to vary the flow of dissociated precursors into the deposition chamber. Suitable flow rates are between about 1 standard cubic centimeter per minute (SCCM) to about 1000 SCCM. Higher precursor flow rates increase the rate of deposition of polymer on the substrate.

Dissociation of the precursors can be by thermal, plasma, laser, or other suitable means known in the art. For example, for thermal dissociation, the temperature of the pyrolysis chamber can desirably be sufficiently high to substantially dissociate the precursor into reactive intermediates. Pyrolysis can conveniently be carried out using a resistive heater. For thermal dissociation of precursors of $SiO_2$, a temperature of about 400° C. to about 800° C., alternatively in the range of about 650° C. to about 750° C., and in other embodiments about 650° C. In general, increasing the pyrolysis temperature can decrease the amounts of alcohols in the resulting $SiO_2$ film. For deposition of other oxide layers, other temperature ranges can be used.

For thermal dissociation of organic polymeric precursors, the dissociation temperature can be different from that for the oxide layer. For example, for PPXC, the desired temperature range is from about 550° C. to about 750° C., alternatively from about 600° C. to about 700° C., and in other embodiments about 615° C. The conditions for other types of dissociation processes are well known in the art, and can be tailored to the individual precursors used.

After leaving the dissociation chambers, the reactive intermediates flow through a valve which can be used to select which type of polymer film is to be deposited. Thereafter, the reactive intermediates can flow into a deposition chamber containing a substrate.

Any substrate may be used which exhibits good adhesion to the first layer deposited. The substrate may be a semiconductor wafer comprised of silicon, such as silicon (111), silicon (100), silicon oxide, $CaF_2$, titanium, other metal, or any other desired substrate. The substrate can be cleaned prior to deposition. Cleaning promotes better adhesion of the film layers with the substrate. Suitable cleaning methods are known in the art, but for cleaning silicon or silicon dioxide wafers, for example, such methods include the use of HF, $NH_4OH$ or $H_2SO_4$.

Depositions of successive dielectric layers can be carried out first using one species of reactive intermediate, typically the oxide, although the organic dielectric material can alternatively be deposited first. A thin film of a first dielectric material is typically deposited of desired thickness such as, by way of example only, 10 nm to about 1000 nm, alternatively from about 10 nm to about 500 nm, and in other embodiments about 50 nm, depending upon the desired application. After the first layer of film is deposited, the deposition chamber can be purged of the first reactive intermediate before the flow of the second reactive intermediate species is initiated. Such purging can be accomplished by the bias flow of a gas such as nitrogen, argon or oxygen. After purging, the second species can be introduced into the chamber and a second layer of dielectric material can be deposited. In this fashion, multilayered films of any desired sequence of layers and layer thicknesses can be manufactured. This process can be used to create multilayered films having narrow zones of transition between the types of polymers in the multilayered thin film.

Alternatively, the deposition chamber need not be purged before initiation of flow of the second reactive intermediate species. In this way, both species of reactive intermediates can be co-deposited with the relative amount of the first species decreasing progressively as the second species displaces the first species in the deposition chamber. Thus, the interface between the two layers of dielectric material can transition gradually from one polymer to the other. In this way, films having graded boundaries can be manufactured, in which gradations of dielectric constant, refractive index, or adhesion can be obtained as a function of film thickness.

Deposition of a layer of the second dielectric material can occur until a thin film of the second dielectric material of a desired thickness is achieved, such as, by way of example only, 1 nm to about 1000 nm, alternatively from about 10 nm to about 500 nm, and in other embodiments about 50 nm. The above processes can be repeated until the desired number of dielectric thin film layers and/or desired film thickness is achieved.

The relative amounts of precursor dissociated and the thickness of each layer deposited can be varied to suit specific needs. If a mechanically stronger film is desired, more oxide and less organic polymer can be deposited. Alternatively, if a film having a lower dielectric constant is desired, more organic polymer and less oxide can be deposited. Typically, the overall content of organic polymer can be in the range of from about 10% to about 90%, alternatively from about 30% to about 70%, and in other embodiments about 50%.

Typically, deposition rates can be in the range of from about 1 nm/min to about 2000 nm/min, alternatively in the range of about 10 nm/min to about 500 nm/min, and in other embodiments about 10 nm/min to about 20 nm/min. The deposition rate can depend upon the temperature of vaporization of precursors. Higher vaporization temperatures can result in more rapid volatilization of precursors, which can increase the concentration of precursor available for dissociation into reactive intermediates, and thereby can ultimately increase the deposition of the polymer film.

The deposition temperature can be from about liquid nitrogen temperature to any temperature below the melting temperature of the dielectric material with the lowest melting temperature, typically that of the organic polymer. By way of example only, PPXC can be deposited at liquid nitrogen temperature to about 110° C., alternatively from about 50° C. to about 100° C., and in other embodiments at about 80° C. Similarly, using DADBS, a layer of $SiO_2$ can be deposited at temperatures in the range of from about liquid nitrogen temperature to about 600° C., alternatively in the range of about 0° C. to about 100° C., and in other embodiments about 80° C. It can be desirable to use lower temperatures, because deposition rates for organic polymers can be higher at lower temperatures. However, $SiO_2$ can desirably be deposited at higher temperatures, as the properties of the film can be more desirable when deposited at higher temperatures. Therefore, one can optimize the deposition of each layer to attain the desired balance of film quality and rate of deposition.

These temperature ranges are only for illustration, other temperatures can be used. It can be desirable that the deposition temperature for the oxide layer be similar to that for the organic polymer layer, thus permitting the temperature of components within the deposition chamber to remain nearly constant during the transition of deposition from one type of polymer to another. This can reduce thermal stresses during the deposition process, which can result in stronger thin films and increased efficiency of making the multilayered thin film.

The pressure in the deposition chamber can be in the range of from about 0.01 Torr to about 1 Torr, alternatively in the range of about 0.05 Torr to about 1 Torr, and in other embodiments of about 0.05 Torr to about 0.15 Torr. The flow rates of the precursors can typically be in the range of from about 1 SCCM to about 1000 SCCM.

B. Post-Deposition Processing of Thin Films

After deposition, multilayered thin films can optionally be processed to confer desired characteristics. For example, an annealing step at a temperature above the deposition temperature but below the melting temperature (Tm) can permit the two phases of dielectric material to adhere more tightly to each other. Annealing can also drive out volatile impurities such as water, organic acids, or alcohols from the film, and can create a more uniform crystallite structure which increases the reproducibility of the physical, chemical, and electrical properties of the film. Furthermore, an annealing step can increase the degree of crystallinity.

If desired, additional annealing steps can be carried out, for example, at temperatures above the glass transition temperature (Tg) of the organic polymer. This annealing step can reflow and increase the density of the polymer and/or to smooth out imperfections in the surface of the film. Additionally, an additional annealing step can be carried out to alter the structure of the films. Both pure PPXC films and multilayered films containing $SiO_2$ and PPXC become amorphous after annealing at temperatures above the Tg. Thus, by annealing at temperatures above the melting temperature, a crystalline film can be at least partially converted to an amorphous film.

III. General Methods for Characterizing Thin Films

The thickness and optical characterization of the thin films of the invention can be carried out by using a variable angle spectroscopic ellipsometer (VASE), obtained for example, from the J.A. Woollam Company. The wavelengths of light to be used can vary from about 400 nm to about 1000 nm and three angles, 70°, 75° and 80° normal to the sample can be typically used. The parameters obtained from VASE can be delta and psi, which are trigonometric parameters which define the resultant ellipsoid after linearly polarized light is ellipsometrically polarized after interacting with the thin film. A Cauchy model can be fit to delta and psi to derive a thickness value and dispersion curves for the indices of refraction and the extinction coefficients for multilayer, oxide and organic polymer films.

To study the nature of the chemical species in the thin films, Fourier Transformed Infrared spectroscopy can be used. For example, a Perkin Elmer model 1600 FTIR was used for infrared spectroscopy experiments described below. For experiments analyzing the infrared spectra of oxide, organic polymer, and multilayered films, a $CaF_2$ single crystal substrate can be typically used. These films can be analyzed at wavenumbers of about 4000 $cm^{-1}$ to about 880 $cm^{-1}$. For example, films made from the precursor DADBS can be typically analyzed at wavenumbers of about 4000 $cm^{-1}$ to about 625 $cm^{-1}$ after preparing a neat cell consisting of NaCl single crystals. Four scans are typically made for both the background and the thin film samples with a resolution of about 4.0 $cm^{-1}$ for each scan.

Measurements of the thin film's dielectric constant and dielectric loss can be obtained using standard instruments and methods, including for example, a Solarton S1 1260 Impedance Analyzer. A alternating potential of about 50 mV is typically applied to the sample. A top electrode made out of sputter-deposited platinum, can have a circular area in the range of about $4.26 \times 10^{-4}$ $cm^2$ to about $9.62 \times 10^{-4}$ $cm^2$. The silicon dioxide film can be deposited onto a highly doped p-type polycrystalline silicon, which had good adhesion properties to the deposited silicon dioxide. The multilayer films can also be deposited onto aluminum, which had a Si(111)/Cu/Al substructure, to mimic an actual intermetallic dielectric/interconnect system. A simple RC parallel circuit can be used to calculate the capacitance and dielectric loss. Generally, measurements of capacitance and dielectric loss are obtained at a frequency of about 10 kHz. The dielectric constant can be calculated u sing standard methods, and assuming a parallel-plate capacitor configuration, the thickness measured by VASE, and the electrode area as measured using an optical microscope.

Leakage current, electrical resistivity and dielectric breakdown of thin films are obtained using methods known in the art. Those methods can include using a Hewlett Packar d model 4140B pico amp/DC voltage source. Silicon dioxide films can be grown on top of a physically vaporized titanium film on (111) silicon, whereas the multilayer films can be desirably grown on aluminum. Both $SiO_2$ and the multilayer films can have top electrodes made of sputter-deposited platinum, deposited as a matter of convenience. Values obtained for electrical resistivity and leakage current can be typically obtained at 1.0 MV/cm, corresponding to a voltage of 2.55 V for a 25 nm thick film for the $SiO_2$ films and 18 V for a 180 nm thick multilayer film. Finally, X-ray diffraction data can be obtained with a Scintag XDS-2000 (Sunnyvale, Calif.) X-ray diffractometer or equivalent device, for example, using Cu Kα radiation of 1.5418 Å. For purposes of evaluation, the thickness of the PPXC and multilayer films used for XRD can be adjusted to provide roughly the same net thickness of organic polymer in each film. For example, for PPXC films, the thickness selected for a pure PPXC film can be about 246 nm and the thickness of a multilayer film can be about 370 nm, therefore, permitting the evaluation of pure PPXC and multilayered films having about the same amount of organic film.

IV. Properties of Oxide/Polymer Mulitilayered Thin Films

Multilayered films of certain embodiments of the invention can exhibit electrical and mechanical properties which are improved compared to the prior art thin films. The dielectric constant of a pure $SiO_2$ films is about 4.0, whereas the dielectric constant of a multilayered film comprising 20% $SiO_2$ and 80% PPXC can be about 3.30. This decrease in dielectric constant can lower power consumption, decrease cross-talk between elements and can decrease interconnect or RC-delay. The decrease in dielectric constant can permit higher densities of device features to be manufactured, and thereby result in increased computation speed and increase memory storage capacity for semiconductor products.

Previous thin films consisting of either oxide or organic polymer separately required a manufacturer to balance the advantages of each type of film against the disadvantages. Thus, if a manufacturer desires a strong, thermally stable film, $SiO_2$ can be a desired material. However, if a manufacturer desires a film having a low dielectric constant, an organic polymer can be a desired material. However, no single type of film of the prior art has both the strength and thermal stability of $SiO_2$ and the low dielectric constants of organic polymer films. During manufacture of multilayered films, the relatively high mechanical strength and thermal stability of $SiO_2$ films can be maintained, as can the low dielectric constant of the organic polymer film. Therefore, the multilayered films of embodiments of this invention can have higher mechanical strength, thermal stability and lower dielectric constants than either $SiO_2$ films or organic polymer thin films manufactured using conventional methods.

Multilayered films can be made that are substantially free of contaminants. The multilayer films synthesized made from DADBS at relatively low pyrolysis temperatures can show the presence of t-butanol and acetic acid. These species are derived from the precursor DADBS and can be appear in the film under conditions of incomplete pyrolysis. However, little or no DADBS can be detected in films where the DADBS was pyrolyzed at temperatures sufficiently high for the DADBS was fully converted to the reactive intermediate. As with DADBS, desirable temperatures for dissociation of other precursors can be determined.

The index of refraction and extinction coefficient of the multilayer films can exhibit more dispersion than either the PPXC homopolymer or the $SiO_2$ homopolymer. The increased refraction and extinction coefficient of the multi-layered film can reflect a disordered interface between the polymer and $SiO_2$ films. A higher extinction coefficient results in higher AC and DC and optical loss, which can increase the loss of electrical signals. However, the loss is still low enough to permit the use of multilayered structures in electrical applications.

Moreover, annealing the films at certain intermediate temperatures can increase the crystallinity of the films. By increasing the crystallinity, the films can become more transparent. The XRD pattern for PPXC films indicated the growth of existing and new crystallites after a 150° C. post-deposition annealing step as evidenced by the change in d-spacing and the increase in the average crystallite size (Table 1). When the same film was annealed at 200° C., the amount of crystallization in the film increased. However, the average crystallite size did not substantially increase, indicating that more crystallites were formed and grew as opposed to existing crystallites growing to larger sizes.

Surprisingly, when the same films were annealed at 350° C. and then subsequently cooled, the XRD spectrum showed a substantial reduction in the amplitude of a peak, indicating that the structure had developed an increased amorphous structure. Amorphous materials can exhibit isotropic optical, electrical and mechanical properties. In contrast, semi-crystalline or crystalline polymer thin films exhibit anisotropic dielectric properties which can be undesirable if a manufacturer's priority is for reducing RC-delay, cross-talk and power consumption of electrical devices. Thus, in situations in which RC-delay, cross-talk, and power consumption are desirably minimized, it can be advantageous to anneal a multilayered film at a temperature sufficiently high to at least partially alter the structure of the film from crystalline or semi-crystalline to amorphous.

The XRD spectra of the multilayer films can be different from the XRD spectra of pure PPXC films. The PPXC films having thicknesses approximately 35 nm thick deposited at 80° C. to 85° C. can have very little crystallinity, but crystallinity appeared after the films were annealed at 150° C. (Table 1). This crystallinity did not increase like that of the thicker PPXC films, but stayed constant. However, annealing the multilayer films at 350° C. can cause the film to become amorphous as can occur with the PPXC films annealed at the same temperature.

The theories of action presented above only represent possible theories to account for the properties of the films of certain embodiments of the present invention, and we do not rely upon any particular theory for operability.

Further aspects of the invention are apparent by considering the examples and the figures.

EXAMPLES

Example 1

Apparatus for Deposition of $SiO_2$/Parylene-C Multilayered Films

FIG. 1 shows a schematic diagram of a reactor 100 of an embodiment of this invention for making multilayered films. Separate sublimation/vaporization chambers and pyrolysis tubes for the dissociation of the oxide and organic polymeric precursors are provided, and are attached to a single, common deposition chamber 112. To deposit a multilayered film of certain embodiments of this invention, the $SiO_2$ precursor, DADBS 112, was held in a precursor holder 114 which was heated to vaporize the DADBS 112. The vaporized DADBS passed through an area 116 warmed to 99° C. and into a pyrolysis chamber 118 which was heated to a temperature in the range of about 615° C. to about 650° C. to convert the DADBS into reactive intermediates.

The poly(chloro-p-xylylene) precursor DPXC 102 was placed in a vaporization chamber 104 and was vaporized at a temperature of 116° C. The vaporized precursor was transported through a pipe 108 which was heated to a temperature of 210° C. to prevent deposition of the precursor on the walls of the pipe. Chamber vent 106 was used to equalize pressure in the elements of the apparatus. Chamber vent 106 was also used to bring the reactor to atmospheric pressure after deposition of the thin film so the deposited films and substrates can be removed from the reactor. The vaporized DPXC passed into a pyrolysis tube 110 which was heated to a temperature of 600° C. to dissociate the DPXC into reactive intermediates.

The substrates used for depositing the multilayer films were wafers of silicon (111) that were cut by a carbide scribe into dimensions of about 1.5 cm×2 cm. The substrates were dried under nitrogen and then placed in the deposition chamber 122 and held in place on a substrate holder (not shown). After loading the deposition chamber 122, the door 124 was closed, and the pressure in the system was reduced to about 0.105 Torr to about 0.220 Torr using pump 134. The pressure was monitored using a pressure gauge 130, connected to the pump 134 by way of a tube with a valve 132. The valve 132 was used to regulate the flow of gas and to inhibit the vacuum pump oil from flowing back into the reactor.

Example 2

Deposition of a Film of $SiO_2$

An $SiO_2$ film 125 nm thick was deposited on $CaF_2$ from the precursor DADBS at a temperature of about 71° C. to about 75° C. To deposit the first layer of $SiO_2$, the valve 120 can be adjusted to permit the flow of $SiO_2$ precursors into deposition chamber 122. The valve 120 can be heated to a temperature of 210° C. to prevent deposition of polymers on the valve and tubing. The reactive intermediates for the formation of $SiO_2$ can be transported to a deposition chamber 122 where they can be deposited at 80° C. to 85° C. and can polymerize to form the first $SiO_2$ layer.

Figure 2:
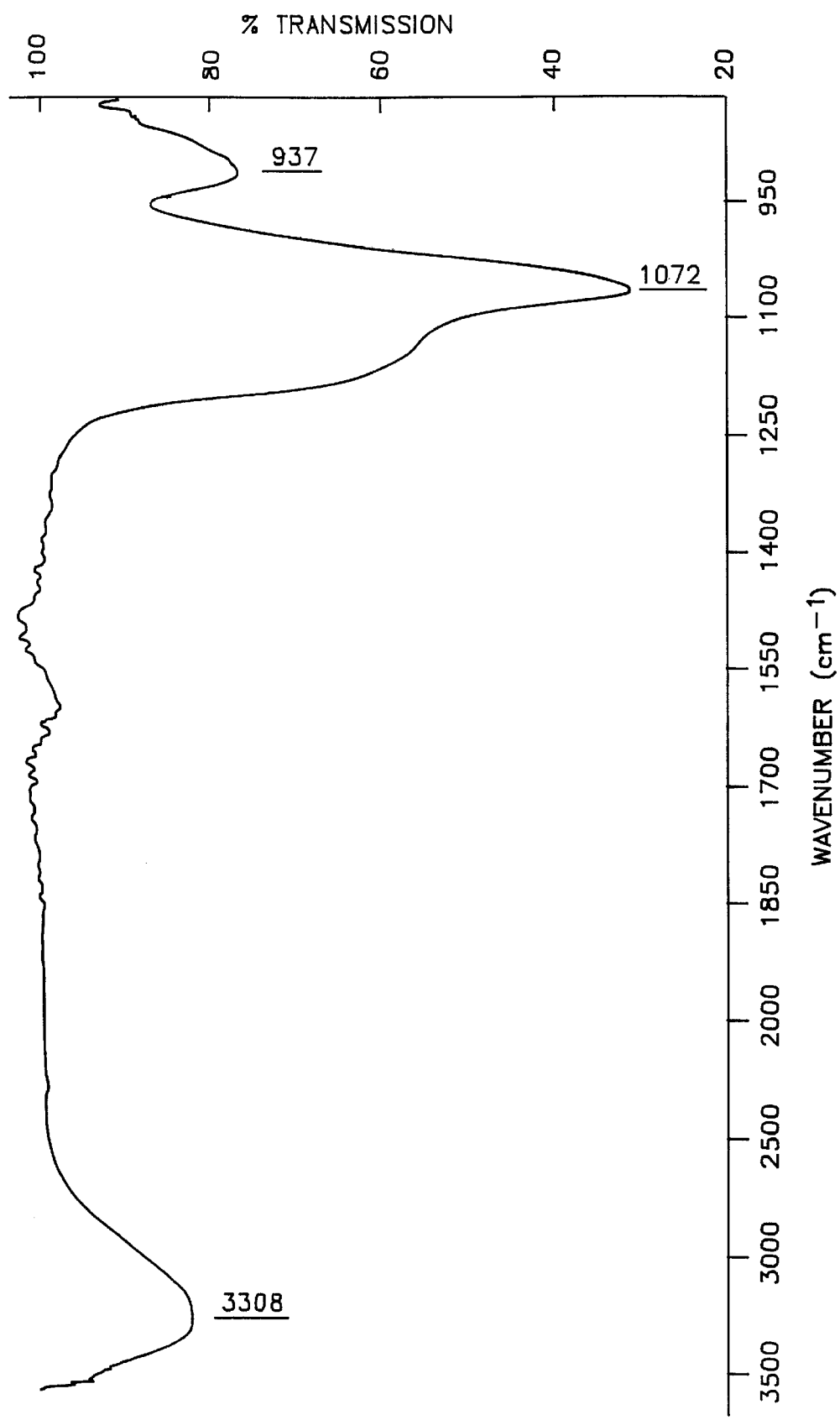
FIG. 2 shows Fourier Transformed Infrared (FTIR) spectrum of a film of an embodiment of the invention comprising $SiO_2$ deposited at from the alkoxysilane precursor diacetoxy-di-t-butoxysilane (DADBS).

FIG. 2 shows the IR spectrum of the film of $SiO_2$ measured from wavenumbers of 880 $cm^{-1}$ to 3700 $cm^{-1}$. The major peak observed at 1072 $cm^{-1}$ was possibly due to asymmetrical stretching of the Si—O—Si bond in $SiO_2$. This is also called the transverse optical (TO) mode (Lee et al., *J. Electrochem Soc.* 143(4):1443–1451 (1996)). This broad peak can create the characteristic asymmetrical hump of $SiO_2$ (Pai et al., *J. Vac. Sci. Technol* A. 4(3):689–694 (1986); Almeida et al., J. Appl. Phys. 68:4225–4232 (1990)). Thus, the major component of this film is $SiO_2$. The peak may be deconvoluted into three separate peaks (Goullet et al., *J. Appl. Phys.* 74:6876–6882, 1993) at 1024 $cm^{-1}$ to 1052 $cm^{-1}$, at 1071 $cm^{-1}$ to 1093 $cm^{-1}$ and at 1123 $cm^{-1}$ to 1177 $cm^{-1}$.

In addition to the major peak at 1072 $cm^{-1}$, three other, smaller peaks were observed in the IR spectrum of the $SiO_2$ film shown in FIG. 2. The large peak at 3308 $cm^{-1}$ can be due to —OH stretch, and can be attributable to the presence of water in the film. The peak observed at 937 $cm^{-1}$ can be due to the Si—OH stretch (Lee, et al. *Electrochem Soc.* 143(4): 1443–1451(1996). The Si—OH stretch can also appear between wavenumbers of 3600 $cm^{-1}$ and 3200 $cm^{-1}$, but the large —OH stretch at nearby wavenumbers apparently obscured that peak.

The by-products of dissociation of DADBS, acetic acid (boiling point (bp): 116° C. to 117° C.) and t-butanol (bp: 83° C.), were absent from this film. The major adsorption peak of t-butanol is at 2963 $cm^{-1}$ appeared only a minor distortion in the baseline in FIG. 2, and the major broad adsorption peak of acetic acid, centered at 1709 $cm^{-1}$, due to the presence of carbonyl-oxygen atoms of acetic acid was not substantial. Thus, the peak observed at 3308 $cm^{-1}$ could have been due to Si—OH and —OH of $H_2$) absorbed by the film during manufacture. These results mean that the $SiO_2$ film was substantially uncontaminated, in that the film did not contain substantial amounts of either the undissociated precursor or by-products.

Example 3
Deposition of a Multilayered Film of $SiO_2$ and PPXC

Figure 3:
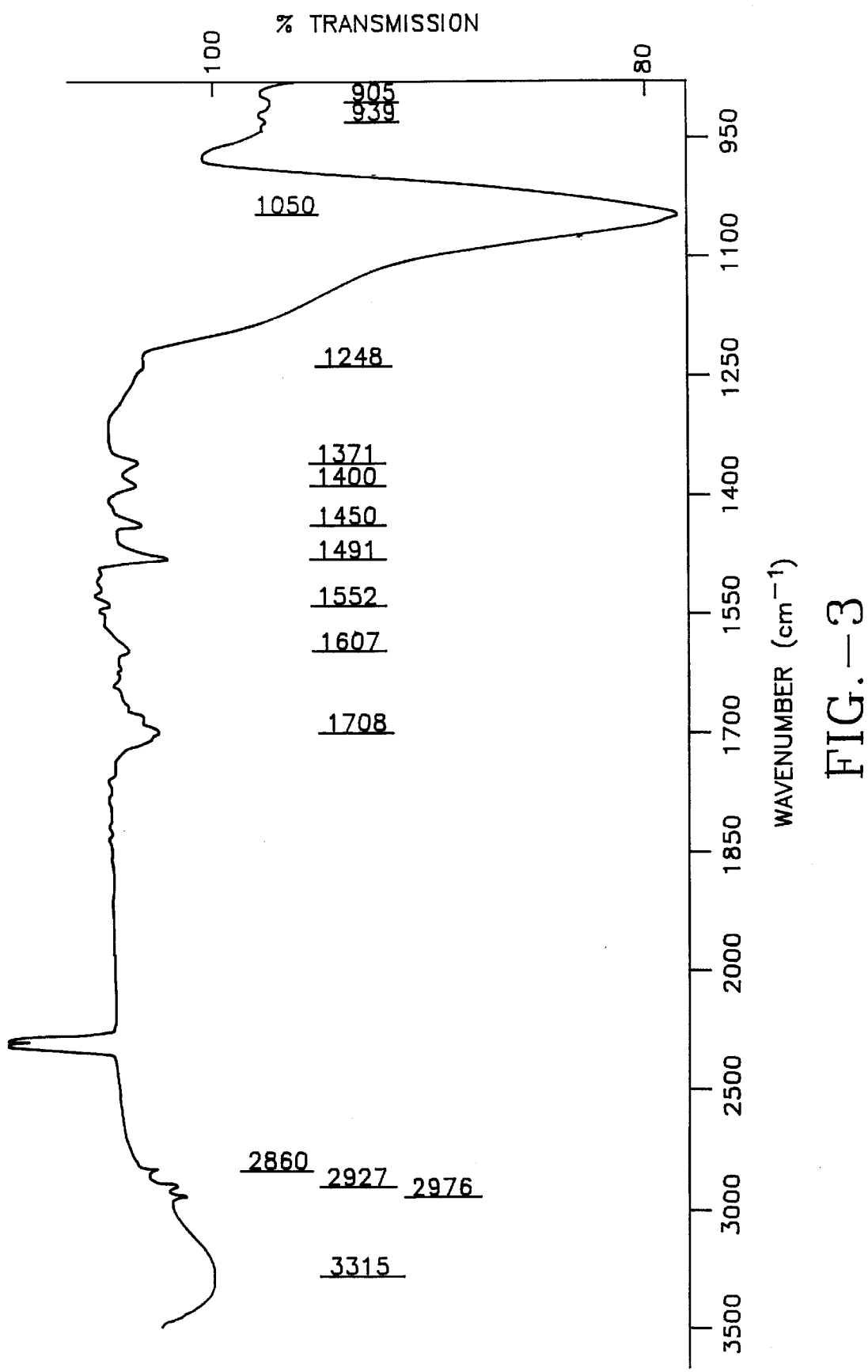
FIG. 3 shows the FTIR spectrum of a multilayered thin film deposited at temperatures of 80° C. to 85° C. of an embodiment of the invention, made from the $SiO_2$ precursor DADBS and the PPXC precursor DPXC.

A multilayered film of an embodiment of this invention was deposited on $CaF_2$ using apparatus and methods as described in Examples 1 and 2 above. FIG. 3 shows the infrared spectrum of a multilayered film comprising 65% PPXC and 35% $SiO_2$. The structure of the film is $CaF_2$/PPXC/$SiO_2$/PPXC/$SiO_2$ (thickness=53 nm/30 nm/53 nm/30 nm). The major peak at 1072 $cm^{-1}$ reflected strong adsorption, and the PPXC spectrum did not have an equivalent large peak like the Si—O—Si stretch observed for films made of $SiO_2$. The spectrum of a multilayer film having a thickness of 172 nm shown in FIG. 3 was dominated by PPXC. The peak at 1050 $cm^{-1}$ in FIG. 3 was shifted from 1072 $cm^{-1}$ compared to that in FIG. 2.

Figure 4:
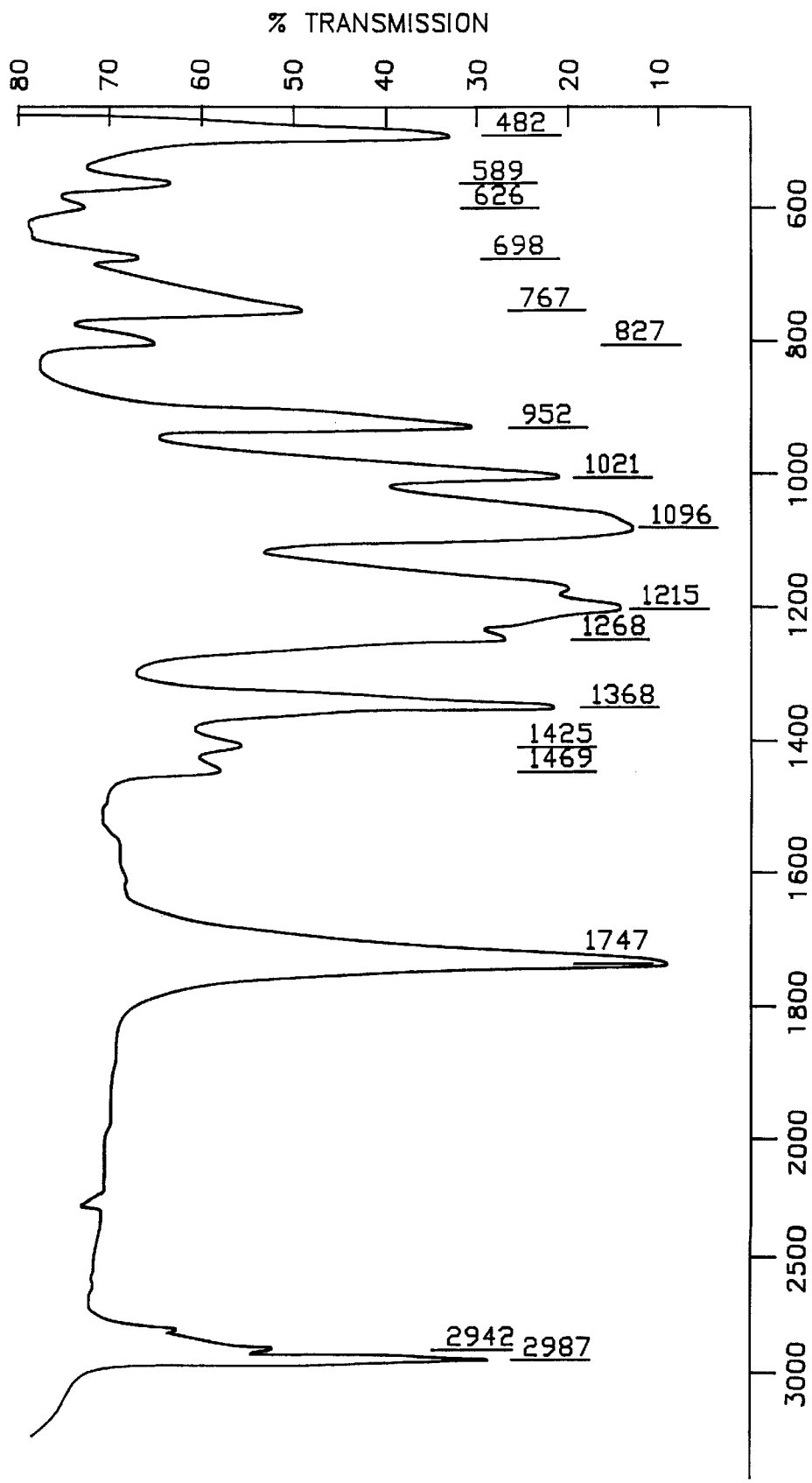
FIG. 4 shows the FTIR spectrum of DADBS prepared in a neat cell with single crystal NaCl plates.

FIG. 4 shows the infrared spectrum of the precursor, DADBS. This spectrum showed a major adsorption peak at 1747 $cm^{-1}$, which could have been due to the carbonyl (C=O) stretch of acetic acid, and did not appear in the $SiO_2$ spectrum (FIG. 2) or in the multilayer spectrum (FIG. 3). However, the peak at 1747 $cm^{-1}$ did appear in the multilayered structures in which the $SiO_2$ precursor were pyrolyzed at low temperatures.

The peaks observed at 2987 $cm^{-1}$ and 2942 $cm^{-1}$ could have been be due to the C—H stretch of t-butanol. The peak at 1368 $cm^{-1}$ could have been be due to C—C stretch of t-butanol, and the peaks clustered around 1215 $cm^{-1}$ could have been be due to C—O stretching in acetic acid and t-butanol. The peak at 1096 $cm^{-1}$ can be due to Si—O stretch in acetic acid and t-butanol.

Moreover, the boiling point of DADBS is 231° C. and therefore has an appreciably lower vapor pressure than acetic acid, whose boiling point is 116° C. to 117° C., or t-butanol, whose boiling point is 83° C. Thus, in a manufacturing process using high processing temperatures, acetic acid and t-butanol can be preferentially excluded from the $SiO_2$ or multilayer films. This can account for the relatively smaller peaks observed for acetic acid and t-butanol deposited at higher temperatures.

Example 4
Deposition of a Film of PPXC

Figure 5:
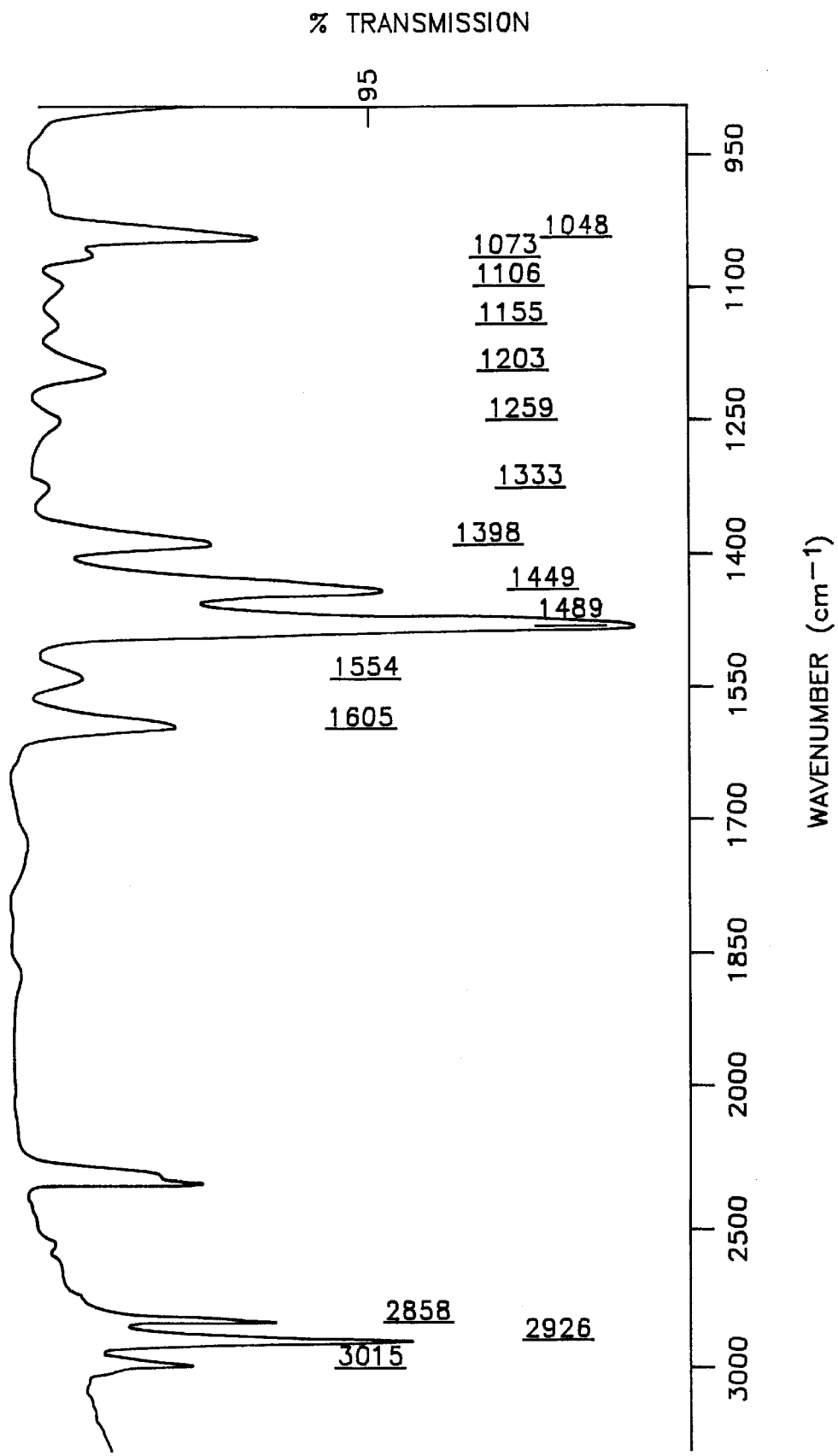
FIG. 5 shows the FTIR spectrum of PPXC deposited from DPXC at 80° C. to 85° C.

A film of PPXC was deposited at 80° C. to 88° C. from the precursor DPXC on a substrate made of $CaF_2$. FIG. 5 shows the IR spectrum of the 257 nm thick film of PPXC. The spectrum was obtained at wavenumbers from 880 $cm^{-1}$ to 3200 $cm^{-1}$. Two sets of peaks were observed that are characteristic of PPXC. The group of peaks at 3015 $cm^{-1}$, 2926 $cm^{-1}$ and 2858 $cm^{-1}$ can be due to —CH stretching. The peaks could have been split into three because of the different types of —CH bonding which can occur in the PPXC monomer unit. The other set of peaks characteristic of PPXC were observed at wavenumbers of 1489 $cm^{-1}$, 1449 $cm^{-1}$ and 1398 $cm^{-1}$, which could have been due to the C—H bending and C—C stretching, both being types of bonds in PPXC which can have π-bonding structure. The peak observed at 1605 $cm^{-1}$ was characteristic of aromatic C—C stretching.

Some peaks appeared in the spectrum of the multilayered film that were not observed in either the $SiO_2$ film or the PPXC film. The peaks 2976 $cm^{-1}$ and 1371 $cm^{-1}$ can be due to t-butanol and the peak at 1708 $cm^{-1}$ can be due to acetic acid. The peaks from 905 $cm^{-1}$ to 939 $cm^{-1}$ can be due to Si—OH bonding in the $SiO_2$ layer and can be due to the incorporation of t-butanol entering the $SiO_2$ layer during deposition of the PPXC film. Additionally, interfacial reactions occurring between the $SiO_2$ layer and PPXC can produce Si—O—C bonding that can appear in the same region as the large asymmetrically broadened peak observed at 1050 $cm^{-1}$.

Figure 6:
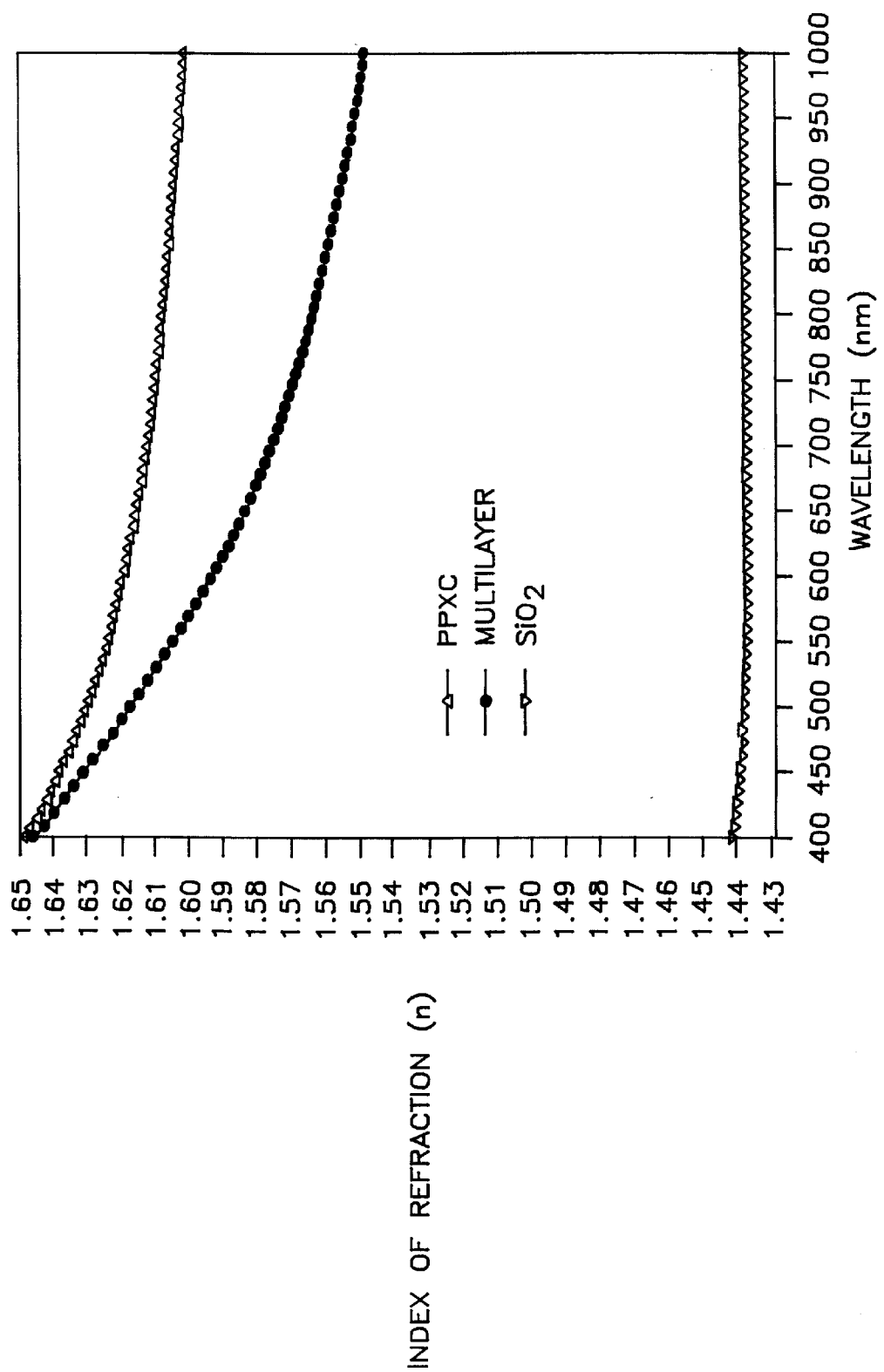
FIG. 6 shows data on the index of refraction of PPXC, $SiO_2$, and a multilayered thin film of $SiO_2$ and PPXC of an embodiment of the invention.

Example 5
Index of Refraction of Films made of $SiO_2$ and PPXC and Multilayered Films The indices of refraction of the $SiO_2$, PPXC and multi-layered films described in Examples 2, 3, and 4 were measured as a function of the wavelength of incident electromagnetic radiation of 400 nm to 1000 nm using VASE. The results are shown in FIG. 6. The thickness of the films as modeled by an isotropic Cauchy dispersion model were determined to be 246 nm, 85 nm and 166 nm for the PPXC, SiO2 and multilayer films, respectively. The multilayer films were further modeled in terms of the following structure: Si(111) (substrate)/native $SiO_2$(3 nm)/PPXC/$SiO_2$/PPXC/$SiO_2$ which resulted in calculated thickness of 41, 22, 72, 31 nm (±4 nm for each layer) for the alternating layers of PPXC and $SiO_2$.

$SiO_2$ showed less dispersion than either the multilayer films or PPXC film shown in FIG. 6, and the index of refraction of $SiO_2$ at 630 nm was 1.44, which is comparable to the observed index of refraction reported in previous work for $SiO_2$ deposited at 410° C. to 600° C. using DADBS (Smolinsky et al., *Mat. Res. Soc. Symp. Proc.* 390:490–496 (1986)). Therefore, the density of the $SiO_2$ film deposited using the methods of embodiments of this invention were similar to the density of films deposited using conventional methods. The multilayer films showed much higher dispersion than the PPXC homopolymer, possibly due to the presence of interfacial regions between the $SiO_2$ and PPXC layers. For PPXC, the index of refraction of 1.62 at 630 nm was lower than other published values. This could have been due to the thinner film (Beach, *Encycl. Polym. Sci. & Tech.*, Wiley, New York, 17: pp. 990–1025 (1989)). As later discussed, a correlation can exist between the thickness of the polymer film and the degree of crystallinity, which in turn, can be affected by the deposition temperature. A lower degree of crystallinity can produce a less dense polymer, which can lower the index of refraction.

Figure 7:
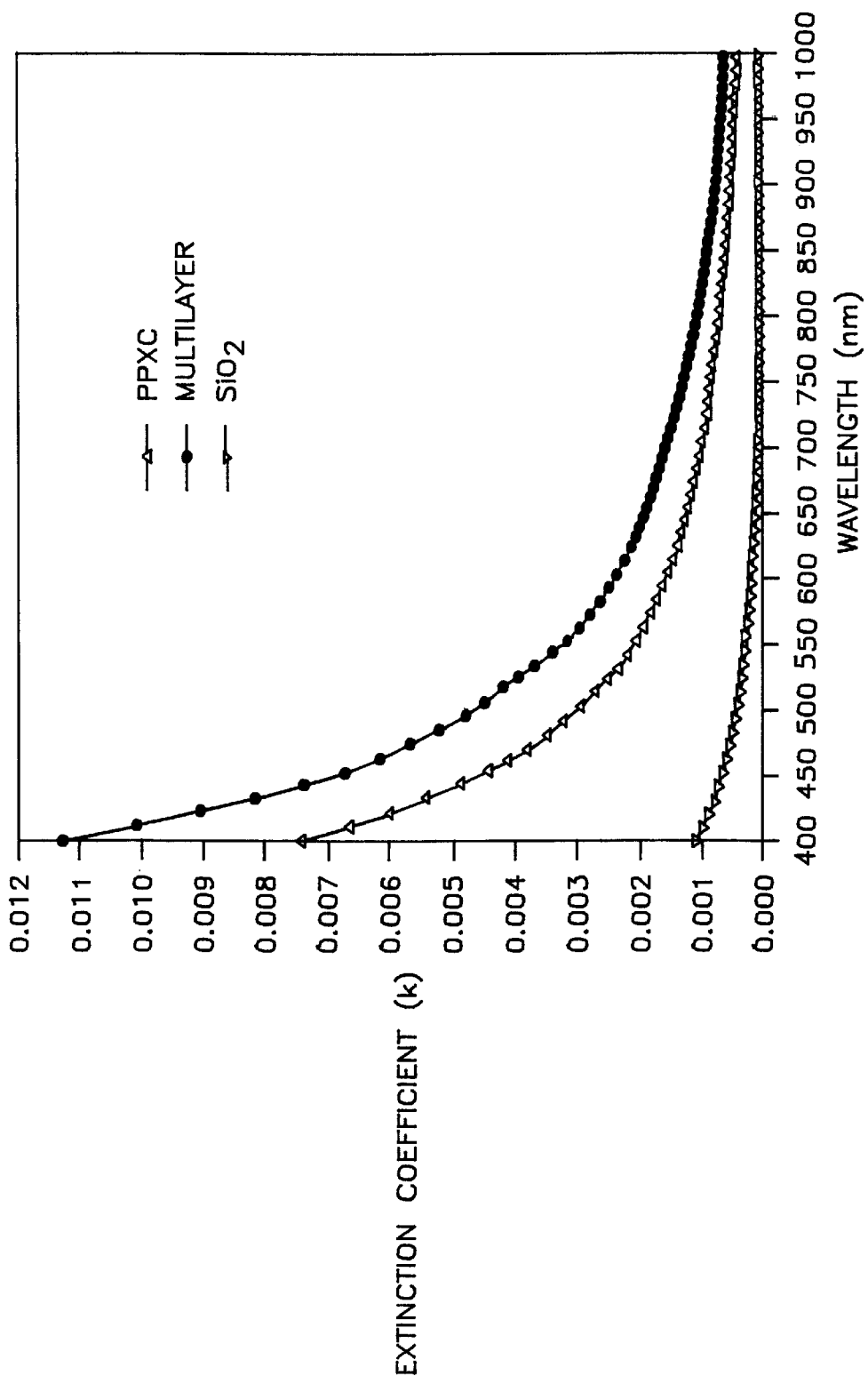
FIG. 7 shows data on the extinction coefficients of PPXC, $SiO_2$, and a multilayered thin film of $SiO_2$ and PPXC of an embodiment of the invention.

Example 6
Extinction Coefficients of Films of SiO₂ and PPXC and Multilayered Films FIG. 7 shows the extinction coefficients of PPXC, $SiO_2$, and the multilayer films at wavelengths of from 400 nm to 1000 nm using VASE and calculated using an isotropic Cauchy model. The films that were studied were the same as shown in Examples 2, 3, and 4. As expected, the multilayer films had the largest coefficients of extinction, which correlates with the indices of refraction. The large extinction coefficients observed for the multilayer films could have been due to the interface between the polymer and $SiO_2$ layers absorbing visible, near IR photons to a greater degree at every wavelength analyzed. The disordered structure at the interfaces can decrease light transmission through the film. Although this theory may account for the observation, other theories may also account for the results.

Example 7
Structural Properties of PPXC and Multilayered Films

Figure 8:
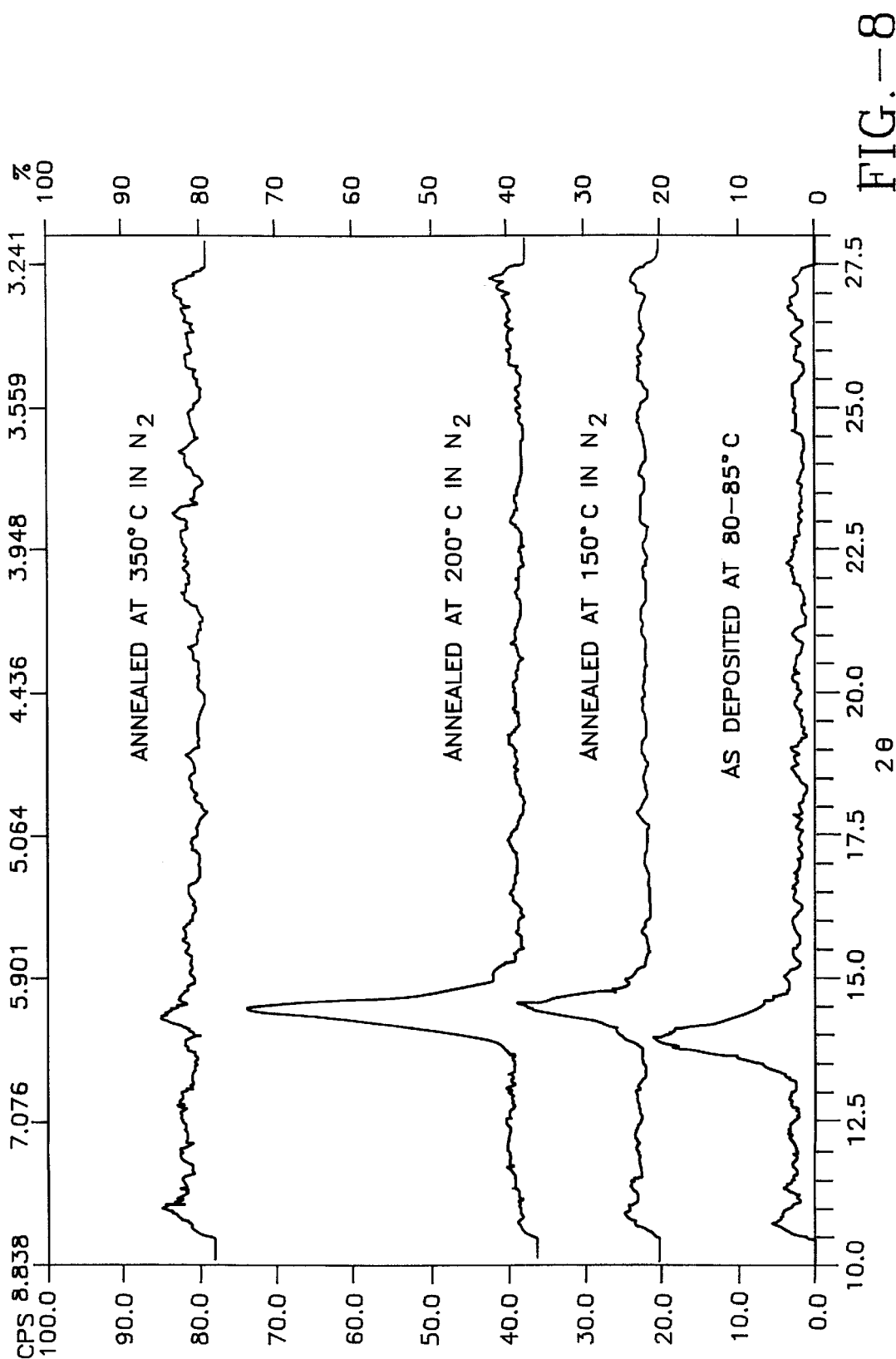
FIG. 8 shows the X-ray diffraction (XRD) spectra of a thin film of PPXC.

Structural information relating to the crystallinity of a PPXC film having a thickness of 246 nm is presented in FIG. 8, which shows XRD spectra from 10° to 28° 2θ. The 2θ value of 13.93° for the unannealed film closely matched the other experimentally determined value of 13.95° for the (020) plane of the monoclinic unit cell having dimensions: a=5.96 Å b=12.69 Å c=6.66 Å P=1 35.20 (Isoda et al., *Bull. Inst. Chem. Res.*, Kyoto Univ. 61(3):222–228 (1983)). After annealing for 4 hours in nitrogen at a temperature of 150° C., a temperature above the glass transition temperature (Tg) of the organic polymer, and after subsequent cooling at a rate of 3° C./min to room temperature, the observed peak shifted to 14.34°2θ and a reduction in the full width at half maximum (FWHM) was apparent. Table 1 summarizes the X-ray diffraction data for both the PPXC homopolymer and the multilayer thin films.

TABLE 1

Crystal Features Of Films Made Of PPXC And SiO₂/PPXC Multilayered Films

| Film Composition | 2θ | d-spacing (Å) | FWHM (° 2θ) | Crystallite Size (Å) |
| --- | --- | --- | --- | --- |
| PPXC unannealed | 13.93 | 6.352 | 0.8654 | 185 |
| annealed at 150° C. | 14.34 | 6.170 | 0.4777 | 335 |
| annealed at 200° C. | 14.34 | 6.170 | 0.4569 | 351 |
| SiO₂/PPXC unannealed | 14.15 | 6.253 | 0.7961 | 201 |
| annealed at 150° C. | 14.06 | 6.296 | 0.5399 | 296 |
| annealed at 200° C. | 14.25 | 6.211 | 0.5885 | 272 |

The average relative crystallite size was calculated using the well known Scherrer formula:

$$B = \frac{\lambda 0.9}{\cos\theta \, t}$$

where λ is the wavelength of the x-ray radiation, θ is the center of the XRD peak (in radians), t is the mean diameter of the crystallites, and B is the broadening of the diffraction peak measured by its full width at half max (FWHM). Without the use of a standard containing a known crystallite size, the relative crystallite sizes calculated from the Scherrer formula should only be used to compare the relative growth of the crystallites and not the absolute value of the crystallite size.

Table 1 shows that annealing a PPXC film at 150° C. increased the crystallite size from 185 Å to 335 Å, indicating the formation of new crystallites, because the overall crystallinity did not change (as seen by the peak height in FIG. 8). Annealing the same film at 200° C. for 2.25 hours in nitrogen and cooling at 3° C./min the FWHM did not change, but the peak height changed (Surendran et al., *J. Polym. Sci.: Part A Polym. Chem.* 25:2089–2106 (1987)) indicating the growth of more crystallites since the average crystallite size only increased from 335 Å to 351 Å.

Surprisingly, annealing a PPXC film at 350° C. for 1 hour (a temperature above the melting point of PPXC (290° C.), followed by cooling at 1° C./min until 200° C., followed by cooling at 3° C./min to room temperature (FIG. 8, top trace), resulted in an amorphous film, with the peak of about 14°2θ nearly absent. The absence of the peak after annealing means that at even with slow cooling the polymer did re-crystallize substantially.

Multilayered films of certain embodiments of this invention studied had the structure Si(111)(substrate)/native oxide(3 nm)/PPXC/SiO₂/PPXC/SiO₂/PPXC/SiO₂/PPXC/SiO₂/PPXC/SiO₂/PPXC/SiO₂/PPXC/SiO₂, where a total of 14 alternating layers of PPXC and SiO₂ were deposited for 5 minutes each. The total thickness for the entire film was 382 nm, and each organic polymer layer had a thickness of about 35 nm and each SiO₂ layer had a thickness of about 20 nm. The multilayer film was deposited to achieve a net thickness for all the polymer layers to be similar to the thickness of the PPXC film so that the same amount of polymer existed in both films, which made comparisons between the two XRD spectra easier.

The XRD spectrum for the multilayer film (FIG. 9) differed substantially from the spectrum of the PPXC film. The unannealed multilayer film had a very broad peak centered at 14.15° 2θ but no significant crystallinity was observed. However, the crystallites which were present had an average size of 201 Å (Table 1). After a post-deposition anneal at 150° C. and then cooling at a rate of 3° C./min, the crystallites grew to an average size of 296 Å and considerably more crystallinity existed in the films. A peak centered at 14.06° also showed asymmetrical broadening possibly due to mechanical stresses in the film. Mechanical stress can be due to the differences in thermal expansion coefficients between SiO₂ and PPXC induced as a result of the post-deposition annealing step.

The multilayer film annealed at 200° C. for 2.25 hours and then cooled at 3° C./min to room temperature showed a peak centered at 14.25° 2θ with asymmetrical broadening, but the extent of the broadening was less than the broadening observed after the 150° C. post-deposition anneal (Table 1). No increase in intensity was apparent compared to the PPXC film; the FWHM was nearly the same. Therefore, no significant increase in polymer chain mobility was observed at 200° C. compared to the mobility observed after annealing at 150° C. Therefore, annealing at 200° C. did not result in any substantial differences in crystallinity of the films.

Figure 9:
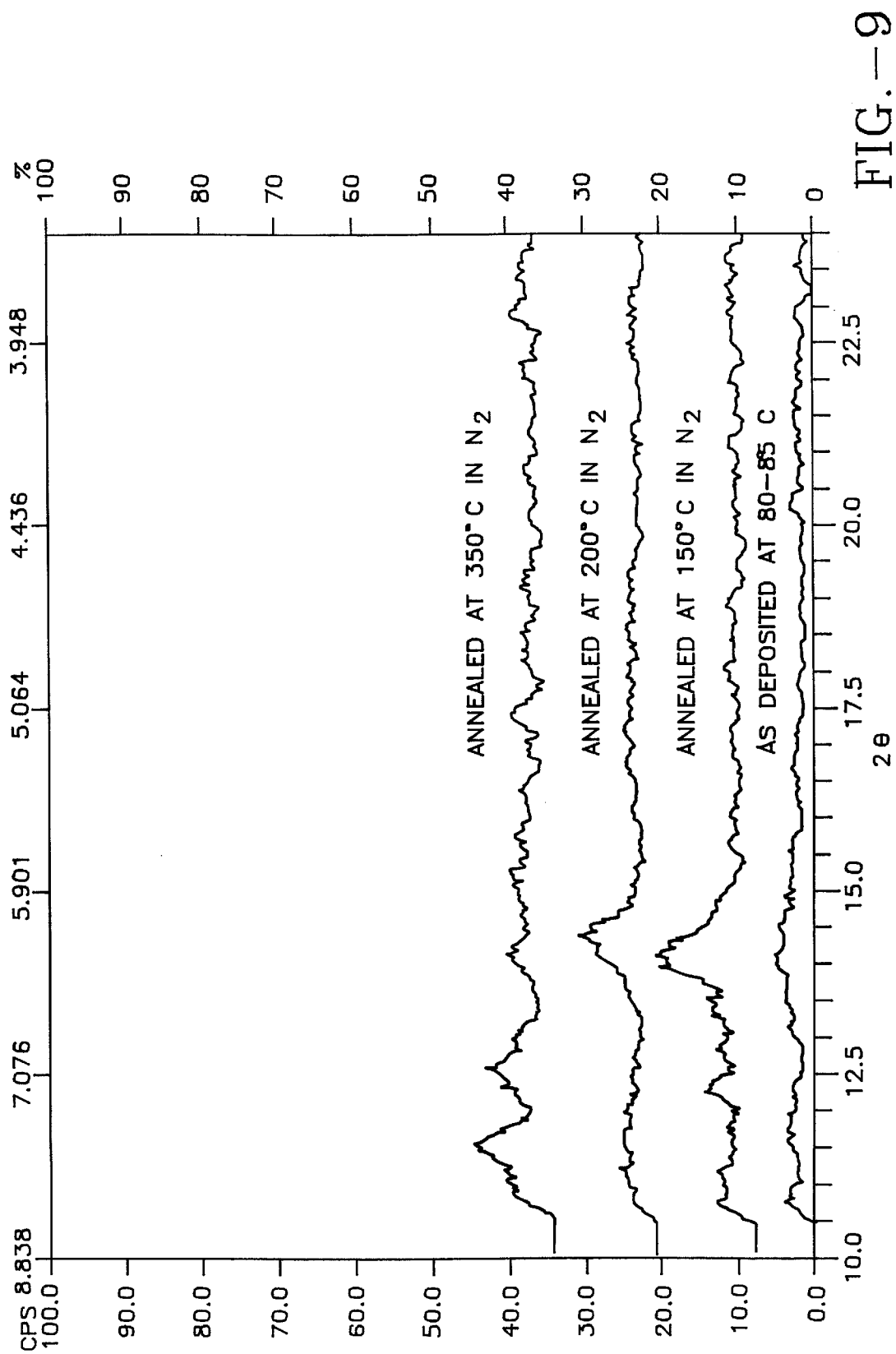
FIG. 9 shows XRD spectra of a multilayered film of an embodiment of the invention comprising $SiO_2$ and PPXC.

As previously demonstrated for PPXC films, the PPXC constituents in the multilayer film became amorphous when heated to 350° C. (above the melting point temperature (TM) of PPXC of 290° C.) followed by cooling at a rate of 1° C./min until 200° C. was reached, then by further cooling at a rate of 3° C./min until room temperature was reached (FIG. 9, top trace). The irreversible transition from semi-crystalline to amorphous structure above the melting temperature of PPXC appeared to be independent of thickness because both phenomena were evident in thin and ultra-thin films.

Example 8
Electrical Properties of Multilayered Films, PPXC Films and SiO$_2$ Films Electrical properties of multilayered SiO$_2$/PPXC films, and films of SiO$_2$ or PPXC were determined and the results are presented in Table 2.

TABLE 2

Electrical Properties of SiO$_2$, PPXC, and SiO$_2$/PPXC Multilayered Films

| Variable | SiO$_2$/PPXC | PPXC | SiO$_2$ |
|---|---|---|---|
| Thickness PPXC (layer 1) | 65 nm | 295 nm | 25 nm |
| Thickness SiO$_2$ (layer 2) | 18 | — | — |
| Thickness PPXC (layer 3) | 82 | — | — |
| Thickness SiO$_2$ (layer 4) | 18 nm | — | — |
| K @ 1 kHz | — | — | 4.0 |
| K @ 10 kHz | 3.30 | 3.13 | — |
| Dielectric loss @ 1 kHz | — | — | 0.0257 |
| Dielectric loss @ 10 kHz | 0.0474 | 0.026 | — |
| Breakdown voltage | 2.3 MV/cm | >3.4 MV/cm | 7.2 MV/cm |
| Leakage current @ 1 MV/cm | 314 pA | <10$^{-3}$ pA | 52 pA |
| Electrical resistivity @ 1 MV/cm | 1.66 × 10$^{12}$ Ωcm | >3.5 × 10$^{18}$ Ωcm | 1.1 × 10$^{13}$ Ωcm |

Table 2 shows that the dielectric constant (K) for the multilayer film comprising 80% PPXC and 20% SiO$_2$ was 3.30. This represented a decrease of about 17% compared to the dielectric constant measured for the films of pure SiO$_2$. The multilayer films showed a higher dielectric loss than either the SiO$_2$ or PPXC films (Beach et al., R.A. Olson Encycl. Polym. Sci. & Tech., Wiley, New York, 17:990–1025 (1989)), and the leakage current was higher for the multilayer films than for either the SiO$_2$ or PPXC films. The results are consistent with the presence of a weak interface between the PPXC and SiO$_2$ layers of the multilayered films.

The theories discussed above to account for the observations are not intended to be limiting. Other theories are possible which can account for the observations, and this invention does not rely upon any particular theory for operability.

Unless otherwise incorporated by reference, all articles, patents and other publications are herein incorporated fully by reference.

The foregoing examples and description are intended to be illustrative only, and are not intended to be limiting to the scope of the invention. Further understanding of the scope of the invention can be found by referring to the claims.

INDUSTRIAL APPLICABILITY

Methods for manufacturing multilayered films and multilayered films are made which comprise alternating layers of oxide and organic polymer. The films are useful in the manufacture of semiconductor devices, in which the advantages of oxide dielectric materials and organic dielectric materials can be attained in one thin film.

Apparatus for manufacturing multilayered films permits the deposition of alternating layers of dielectric films.

The use of multilayered dielectric films made of oxide and organic polymers permits the manufacture of integrated circuit devices with higher device densities, more suitable physical and electrical properties, such as low dielectric constant, higher frequency performance, and high mechanical strength.

We claim:

1. A method for forming a multilayered oxide/organic polymer film on a surface of a substrate in a chamber, comprising, in any order, the steps of:
    (a) forming a film comprising an oxide film on said surface of said substrate from an oxide precursor selected from the group consisting of aluminum (III) n-butoxide, yttrium isopropoxide, titanium-di-n-butoxide (bis-2,4-pentanedionate), zirconium isopropoxide, tantalum (V) n-butoxide, niobium (V) n-butoxide and zinc n-butoxide, said step of forming said oxide film comprises the steps of:
        (i) vaporizing said precursor for the oxide film;
        (ii) dissociating said vaporized precursor for the oxide film;
        (iii) polymerizing said dissociated, vaporized precursor of the oxide film on the surface of said substrate to form an oxide polymer; and
    (b) forming a film comprising an organic polymer in contact with said oxide film.

2. The method of claim 1, wherein the deposition temperature of said precursor for said oxide film is in the range of about 400° C. to about 170° C.

3. The method of claim 1, wherein said step of dissociating said precursor of the oxide film is carried out using a resistive heater.

4. The method of claim 1, wherein the step of dissociating said precursor of the oxide film is carried out at a temperature in the range of about 400° C. to about 800° C.

5. The method of claim 1, wherein the step of dissociating said precursor of the oxide film is carried out at a temperature in the range of about 630° C. and about 650° C.

6. The method of claim 1, wherein the step of polymerizing is carried out at a pressure in the range of about 0.01 Torr to about 1.0 Torr.

7. The method of claim 1, wherein the step of polymerizing is carried out at a pressure in the range of about 0.03 Torr to about 0.2 Torr.

8. The method of claim 1, wherein the step of polymerizing is carried out at a pressure in the range of about 0.05 Torr to about 0.1 Torr.

9. The method of claim 1, wherein the precursor is transported to a dissociation chamber using a carrier gas.

10. The method of claim 9, wherein said carrier gas is selected from the group consisting of nitrogen, argon and oxygen.

11. The method of claim 1, wherein the oxide precursor is transported at a flow rate in the range of about 1 SCCM to about 1000 SCCM.

12. The method of claim 1, wherein the oxide precursor is transported at a flow rate in the range of about 10 SCCM to about 100 SCCM.

13. The method of claim 1, wherein the oxide precursor is transported at a flow rate of about 20 SCCM.

14. The method of claim 1, wherein said step of polymerizing is carried out at a deposition rate of about 1 nm/min to about 2000 nm/min.

15. The method of claim 1, wherein the step of forming an organic polymer film further comprises the steps of:
    (a) vaporizing a precursor for the organic polymer film;
    (b) dissociating said vaporized precursor for the organic polymer film;
    (c) depositing said dissociated, vaporized precursor of the organic polymer film on the surface of said substrate to form an organic polymer.

16. The method of claim 15, wherein said precursor for said organic polymer film comprises a para(xylylene).

17. The method of claim 15, wherein said step of dissociating said organic precursor is carried out using a resistive heater.

18. The method of claim 15, wherein the step of dissociating said precursor for said organic polymer is carried out at a temperature in the range of about 550° C. to about 750° C.

19. The method of claim 15, wherein the organic precursor is transported to a dissociation chamber using a carrier gas.

20. The method of claim 19, wherein said carrier gas is selected from the group consisting of nitrogen, argon and oxygen.

21. The method of claim 19, wherein the oxide precursor is transported at a flow rate in the range of about 1 SCCM to about 1000 SCCM.

22. The method of claim 19, wherein the oxide precursor is transported at a flow rate in the range of about 10 SCCM to about 100 SCCM.

23. The method of claim 19, wherein the oxide precursor is transported at a flow rate of about 20 SCCM.

24. The method of claim 1, wherein the organic polymer is selected from the group consisting of poly(chloro-p-xylylene) (PPXC), poly(dichloro-p-xylylene (PPXDC) and poly(tetrafluoro-p-xylylene), poly(dimethoxy-p-xylylene), poly(sulfo-p-xylylene), poly(iodo-p-xylylene), poly (α, α, α', α', tetrafluoro-p-xylylene)(AF-4), poly(trifluoro-p-xylylene), poly(difluoro-p-xylylene) and poly(fluoro-p-xylylene).

25. The method of claim 1, wherein said organic polymer comprises a polyimide.

26. The method of claim 1 wherein said organic polymer comprises—phenylmaleimide.

27. The method of claim 1, wherein the organic polymer comprises an organic copolymer.

28. The method of claim 27, wherein the organic copolymer is selected from the group consisting of poly (maleimide/parylene) copolymer, poly acenaphthalene/parylene copolymer, divinylbenzene/parylene copolymer, perfluorooctylmethacrylate (PFOMA)/parylene copolymer, 4-vinyl biphenyl/parylene copolymer, 9-vinylanthracene/parylene copolymer, maleic anhydride/parylene copolymer, N-vinyl pyrrolidone/parylene copolymer, 4-vinylpyridine/parylene copolymer, styrene/parylene copolymer, buckminsterfullerene/parylene copolymer, and trihydroperfluoroundecylmethacrylate/parylene copolymer.

29. The method of claim 1, wherein the organic polymer comprises a cross-linked organic copolymer.

30. The method of claim 29 wherein the cross-linked organic copolymer is selected from the group consisting of 2,3,5,7, tetravinyl, 1,3,5,7, tetramethylcyclotetrasiloxane/parylene, 1,3,5, trivinyl, 1,3,5, trimethylcyclotrisiloxane/parylene, tetravinylsilane/parylene/parylene, and 1,1,3,3, tetravinyldimethyldisiloxane/parylene.

31. The method of claim 1, comprising forming a covalently bound oxide-organic polymer film.

32. The method of claim 31 wherein the covalently bound oxide-organic polymer film is selected from the group consisting of vinyl triethoxysilane/parylene, vinyl triacetoxysilane/parylene, and vinyl tri-t-butoxysilane.

33. The method of claim 1, wherein multiple alternating layers of oxide and organic polymer are manufactured.

34. The method of claim 1, wherein said organic polymer film is deposited on said surface of said substrate, and said oxide film is deposited over said organic polymer film.

35. The method of claim 1, wherein the rates of deposition of said oxide film and said organic polymer are in the range of about 1 nm/min to about 2000 nm/min.

36. The method of claim 1, wherein between the steps of forming said oxide film and said organic polymer film, the deposition chamber is purged of previously dissociated precursors.

37. The method of claim 1, wherein the weight percentage of said organic polymer is in the range of about 10% to about 90%.

* * * * *

UNITED STATES PATENT AND TRADEMARK OFFICE
CERTIFICATE OF CORRECTION

PATENT NO.   : 6,358,863 B1  Page 1 of 1
DATED        : March 19, 2002
INVENTOR(S)  : Seshu B. Desu It is certified that error appears in the above-identified patent and that said Letters Patent is hereby corrected as shown below:

<u>Title page,</u>
Item [73], please delete "Quester Technology, Inc." and insert -- Virginia Tech Intellectual Properties, Inc., Blacksburg, Virginia --.

Signed and Sealed this

Eighth Day of July, 2003

JAMES E. ROGAN
*Director of the United States Patent and Trademark Office*